(12) United States Patent
Tomioka

(10) Patent No.: US 6,852,253 B2
(45) Date of Patent: Feb. 8, 2005

(54) METHOD OF FORMING SUBSTRATE

(75) Inventor: Satoshi Tomioka, Kanagawa (JP)

(73) Assignee: Sony Corporation, Tokyo (JP)

( * ) Notice: Subject to any disclaimer, the term of this patent is extended or adjusted under 35 U.S.C. 154(b) by 411 days.

(21) Appl. No.: 09/842,022

(22) Filed: Apr. 26, 2001

(65) Prior Publication Data
US 2002/0016069 A1 Feb. 7, 2002

(30) Foreign Application Priority Data

Apr. 27, 2000 (JP) .................................. P2000-128325

(51) Int. Cl.[7] .............................................. B29D 11/00
(52) U.S. Cl. .................... 264/1.21; 117/88; 117/952; 264/81
(58) Field of Search ................. 264/1.1, 1.21, 264/81; 117/84, 88, 952, 82; 257/190

(56) References Cited

U.S. PATENT DOCUMENTS 6,177,292 B1 * 1/2001 Hong et al.
6,211,095 B1 * 4/2001 Chen et al.
6,252,261 B1 * 6/2001 Usui et al. .................. 257/190

FOREIGN PATENT DOCUMENTS

JP          10-256662         9/1998

OTHER PUBLICATIONS

Nakamura, Shuji, "High–Power Ga P–N Junction Blue Light Emitting Diodes" 12/91 Japanese Journal vol. 30, No. 12A pp. L 1998–L 2001.

Polian, Grimsditch, and Grezegory, "Elastic Constraints of gallium nitride" Apr. 15, 1996, J.App.Phys.,vol. 79,No. 6.

G.H. Olsen and M. Ettenburg, "Calculated stresses in multilayered heteroepitaxial structures" 06/77, Journal of Applied Physics, vol. 48, No. 6.

Hiramatsu, Detchprohm, and Akasaski, "Relaxation Nechanism of Thermal Stresses in the Heterostructure of GaN Grown on Sapphire by Vapor Phase Epitaxy" 04/93, jon. J. Appl. Phys. vol. 23 Part 1, No. 4 pp. 1528–1533.

Bernstein, "Elastic Constants of Synthetic Sapphire at 27oC" 01/63, Journal of Applied Physics vol. 34, No. 1 pp. 169–172.

* cited by examiner

Primary Examiner—Mathieu D. Vargot
(74) Attorney, Agent, or Firm—Rader, Fishman & Grauer PLLC; Ronald P. Kananen

(57) ABSTRACT

Provided is a method of forming a substrate with which a good-quality substrate having few cracks is obtained. On a growth base made of sapphire with a thickness of smaller than or equal to 100 μm, a GaN substrate is grown as heating the growth base, and cooling is provided therefor. At this time, the thickness of the substrate subject to growth is made larger than or equal to 200 μm and the curvature thereof is made smaller than or equal to 0.03 cm$^{-1}$, the curvature being caused by the difference in thermal expansion coefficients of the growth base and the substrate. Thus, even though the substrate is warped due to the cooling after the growth, occurrence of crack in the substrate is prevented and the good-quality substrate is obtained.

24 Claims, 4 Drawing Sheets

METHOD OF FORMING SUBSTRATE

BACKGROUND OF THE INVENTION

1. Field of the Invention

The present invention relates to a method of forming a substrate made of a Group III–V nitride compound including at least one element from Group IIIB elements and at least nitrogen (N) from Group VB elements.

2. Description of the Related Art

In recent years, demand for high-density recording/reproducing or high resolution in optical disks and magnetic optical disks has grown. To fulfill this demand, researches on semiconductor devices capable of emitting lights in a short-wavelength range such as a green-wavelength spectrum or an ultraviolet spectrum have been actively conducted. Known as suitable materials constituting such a semiconductor device capable of emitting lights in the short-wavelength range are Group III–V nitride compound semiconductors such as GaN, AlGaN mixed crystal or GaInN mixed crystal (Jpn. J. Appl. Phys., 30 (1991), L1998).

In general, light-emitting devices using the Group III–V nitride compound semiconductor are manufactured by sequentially growing layers made of the Group III–V nitride compound semiconductor on a substrate using a metal organic chemical vapor deposition (MOCVD) method or a molecular beam epitaxy (MBE) method. Generally, a sapphire ($\alpha$-$Al_2O_3$) substrate or a silicon carbide (SiC) substrate is used as the substrate.

However, lattice constants and thermal expansion coefficients of sapphire and silicon carbide and those of the Group III–V nitride compound semiconductor are different and thus, there exists a problem such that defects or cracks occur in a grown Group III–V nitride compound semiconductor layer. Further, when manufacturing a laser diode (LD) comprising a semiconductor light-emitting device, it is difficult to form end faces of a resonator by performing cleavage. Therefore, development of a Group III–V nitride compound substrate without such problems has been sought.

However, the Group III–V nitride compound has a high saturated vapor pressure. Thus, a manufacturing method which is generally used when manufacturing a substrate made of silicon (Si) or a substrate made of gallium arsenide (GaAs) cannot be used for the manufacture of the substrate made of the Group III–V nitride compound. Heretofore a well-known method for manufacturing the substrate made of the Group III–V nitride compound is a method such that the Group III–V nitride compound is grown on a growth base made of sapphire or gallium arsenide using a MOGVD method, MBE method or hydride vapor phase deposition method. With the use of the hydride vapor phase deposition method, the Group III–V nitride compound substrate can be grown for several $\mu$m to several hundreds $\mu$m per one hour, and thus, the Group HI-V nitride compound substrate can be grown to achieve a usable thickness for a short period of time. It has been reported that a GaN substrate is obtained using this method.

However, with the method of growing the Group III–V nitride compound substrate on the growth base, when the Group III–V nitride compound substrate is grown to achieve a usable thickness, cracks occur in the Group III–V nitride compound substrate due to the difference in thermal expansion coefficients of the growth base and the Group III–V nitride compound substrate. Thus, the quality of the substrate is not sufficient, so that a good-quality Group III–V nitride compound semiconductor layer cannot be grown thereon.

Further, disclosed in Japanese Patent Laid-open No. Hei 10-256662 is a method such that a thin GaN substrate with a thickness of about 300 $\mu$m is grown over a thick growth base made of sapphire with a thickness of greater than or equal to 1 mm, and then the growth base is removed by means of grinding. With this method, by making the thickness of the growth base larger, warping of the growth base caused by a heat treatment during the growth is suppressed, and deterioration in crystallinity of the GaN substrate caused by the warping of the growth base is prevented. However, with this method, stress increases as the growth base becomes thinner through removal of the growth base, and thus cracks or defects occur in the GaN substrate. Further, since the growth base is thick, over or equal to 1 mm, removal of the growth base is difficult.

SUMMARY OF THE INVENTION

The present invention has been achieved in view of the above problems. It is an object of the invention to provide a method of forming a substrate with which a good-quality substrate having few cracks is obtained.

With the method of forming a substrate of the invention, formed is a substrate made of a Group III–V nitride compound including at least one element from Group IIIB elements and at least nitrogen (N) from Group VB elements. The substrate is grown on a growth base with a thickness of smaller than or equal to 100 $\mu$m in a manner that the substrate has a thickness of larger than or equal to 200 $\mu$m and a curvature of smaller than or equal to 0.03 $cm^{-1}$, the curvature being caused by the difference in thermal expansion coefficients of the growth base and the substrate.

The method of forming a substrate of the invention comprises growing, on the growth base with a thickness of smaller than or equal to 100 $\mu$m, the substrate made of the Group III–V nitride compound with a thickness of larger than or equal to 200 $\mu$m. Accordingly, occurrence of crack or the like in the substrate is effectively prevented and thus, good-quality substrate is obtained.

Other and further objects, features and advantages of the invention will appear more fully from the following description.

DETAILED DESCRIPTION OF THE PREFERRED EMBODIMENTS

Embodiments of the present invention will be described below in detail with reference to the accompanying drawings.

[First Embodiment]

FIGS. 1 to 5 show manufacturing steps of a method of forming a substrate according to a first embodiment of the present invention. According to the method of forming a substrate, a substrate made of GaN (gallium nitride) is subjected to formation, for example, if necessary, impurities are doped in the substrate.

Figure 1:
FIG. 1 is a cross section showing a manufacturing step of a method of forming a substrate according to a first embodiment of the invention.

With the embodiment, as shown in FIG. 1, a growth base 11, which is made of, e.g., sapphire, silicon carbide, spinel or gallium arsenide with a thickness of smaller than or equal to 100 μm, e.g., 60 μm is prepared and cleaned with, e.g., an organic solvent.

Figure 2:
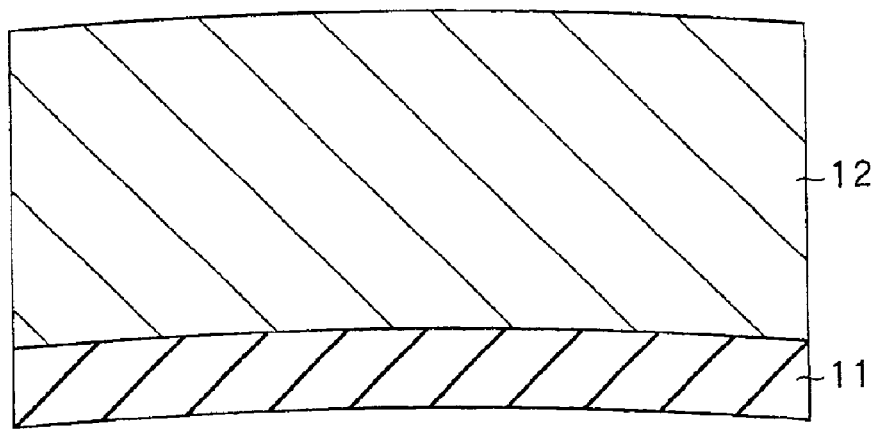
FIG. 2 is a cross section showing a manufacturing step following the step of FIG. 1.

Subsequently, as shown in FIG. 2 while heating the growth base 11, a GaIN substrate 12 is grown on the growth base 11 (on the c-plane when the growth base 10 is made of sapphire, for example) by means of, e.g., hydride vapor phase deposition or halide vapor phase deposition, and then cooling is performed thereon. Here, the hydride vapor phase deposition is a vapor phase deposition method using hydride for reaction or carrying source gas whereas the halide vapor phase deposition is a vapor phase deposition method using halide for reaction or carrying source gas. More specifically, the growth base 11 is placed on a suscepter (not shown) and heated up to about 1000° C. Subsequently, while feeding nitrogen gas ($N_2$) as a carrier gas and ammonia gas ($NH_3$) as a nitrogen source, gallium chloride gas (GaCl) is supplied to the growth base 11 as a gallium source and thus, the substrate 12 is grown, the gallium chloride gas being obtained by flowing hydrogen chloride (HCl) onto a simple substance of gallium (metal gallium) which is heated to about 850° C. In this case, this method is regarded as not only the hydride vapor phase deposition but also the halide vapor phase deposition in that hydrogen chloride is used as source gas.

At this time, the thickness of the substrate 12 subject to growth is greater than or equal to 200 μm and the curvature of the substrate 12 caused by the difference of thermal expansion coefficients of the growth base 11 and the substrate 12 is smaller than or equal to 0.03 cm$^{-1}$. Here, the curvature K of the substrate 12 occurs due to cooling after growth and denotes the curvature of the surface adjacent to the growth base 11. More specifically, when the growth base 11 is made of sapphire or silicon carbide which nearly has a hexagonal crystal system, the curvature K is obtained by the following numerical expression 1.

$$K = \frac{(T_g - T_r)(\alpha_1 - \alpha_2)}{\frac{1}{6} \frac{\overline{E_1}t_1^3 + \overline{E_2}t_2^3}{t_1 + t_2} \left( \frac{1}{\overline{E_1}t_1} + \frac{1}{\overline{E_2}t_2} \right) + \frac{t_1 + t_2}{2}} \quad \text{Numerical expression 1}$$

where K denotes the curvature of a substrate; $\overline{E_1}$ denotes $$\frac{E_1}{1 - \rho_1};$$

$\overline{E_2}$ denotes $$\frac{E_2}{1 - \rho_2};$$

$T_g$ denotes the temperature of a growth base when growing the substrate; $T_r$ denotes the temperature of the substrate when the substrate is left standing after growth; $\alpha_1$ denotes the coefficient of linear expansion, $E_i$ denotes Young's modulus of elongation in the same direction as a direction along which tensile stress is applied in the growth surface of the growth base; $\rho_i$ denotes the Poisson' ratio of shrinkage in a direction vertical to the direction along which tensile stress is applied in the growth surface of the growth base in measuring the Young's modulus; and ti denotes the thickness of the growth base and the substrate where 'i' takes on values between 1 and 2 and when 'i' takes 1, $t_1$ denotes the thickness of the growth base and 'i' takes 2, $t_2$ denotes the thickness of the substrate.

When the growth base 11 is made of spinel, gallium arsenide or silicon, each of which has a cubic crystal system, the curvature K is obtained using different numerical expressions than the numerical expression 1.

Due to the difference in thermal expansion coefficients of the substrate 12 and the growth base 11, warping occurs through cooling after growing the substrate 12. In the embodiment, however, by making the thickness of the growth base 11 smaller than or equal to 100 μm and the thickness of the substrate 12 larger than or equal to 200 μm, stress caused by the warping is concentrated in the growth base 11, and thus, cracks occur exclusively in the growth base 11. Further, the thickness of substrate 12 relative to the growth base 11 is adjusted so that the curvature K of the substrate 12 is smaller than or equal to 0.03 cm$^{-1}$ and thus, the substrate 12 is free from cracks. Accordingly, with the embodiment even though cooling is performed after growing the substrate 12, occurrence of cracks is prevented in the substrate 12, thereby obtaining good-quality substrate 12.

Moreover, by making the thickness of the substrate 12 larger than or equal to 200 μm, usability of the substrate 12 in manufacturing devices and the like using the substrate 12 is improved. In a case where the thickness of the substrate 12 relative to the growth base 11 is set so that the curvature of the substrate 12 is smaller than or equal to 0.025 cm$^{-1}$, occurrence of cracks in the substrate 12 is effectively prevented, which is preferable.

In the case where the substrate 12 contains impurities, impurities are doped in the substrate 12 prior to growth. At least one element selected from a group consisting of carbon (C), silicon (Si), germanium (Ge) and tin (Sn), which are Group-IV elements, and sulfur (S), selenium (Se) and tellurium (Te), which are Group-VI elements, is used as the impurities, for example. Alternatively, at least one element from a group consisting of beryllium (Be), magnesium (Mg), calcium (Ca), zinc (Zn) and cadmium (Cd), which are Group-II elements, and carbon, silicon, germanium and tin, which are Group IV elements, may also be used.

Further, when the substrate 12 is grown by means of the hydride vapor phase deposition or the halide vapor phase deposition, a starting material with the hydrazine system which is expressed by the chemical formula, $N_2R_4$ (R denotes a hydrogen atom or an alkyl group) or organic amine may be used as a nitrogen source instead of ammonia. Examples of the staring material with the hydrazine system, which is expressed by $N_2R_4$, are hydrazine, monomethylhydrazine and dimethylhydrazine. Examples of the organic amine are propylamine, isopropylamine, butylamine, isobutylamine, t-butylamine and secondary butylamine, which are the primary amine; dipropylamine, diisopropylamine, dibutylamine, diisobutylamine, di-t-butylamine and di-secondary butylamine, which are the secondary amine; and tripropylamine, triisopropylamine, tributylamine, triisobutylamine, tri-t-butylamine, tri-secondary butylamine, triallylamine, triethylamine, diisopropylmethylamine, dipropylmethylamine, dibutylmethylamine, diisobutylmethylamine, di-secondary butylmethylamine and di-t-butylmethylamine, which are the tertiary amine.

Further, instead of hydrogen chloride1 hydrogen; fluoride (HF), hydrogen bromide (HBr) or hydrogen iodide (HI) may be used for hydride or halide. Instead of nitrogen gas, inert gas such as helium gas (He) or argon gas (Ar) may be used as the carrier gas. Further, hydrogen gas ($H_2$) or mixed gas including hydrogen gas may be also used as necessary.

Figure 3:
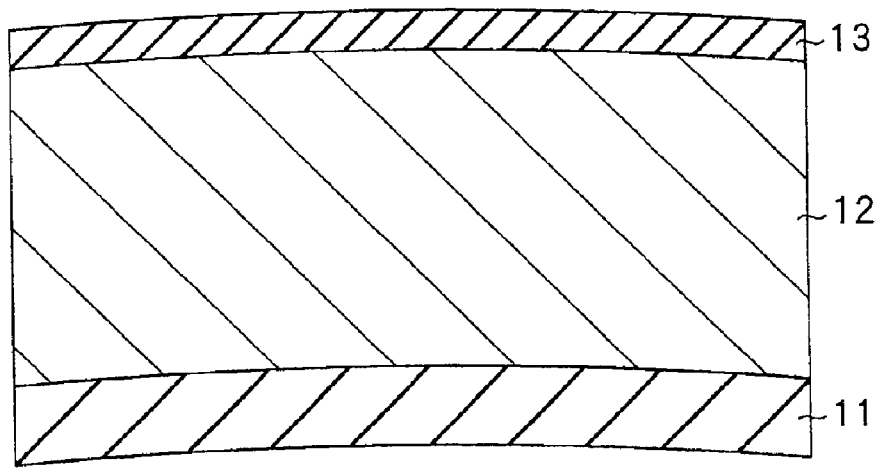
FIG. 3 is a cross section showing a manufacturing step following the step of FIG. 2.

After the substrate 12 is grown and cooled down, as shown in FIG. 3, a protecting film 13 made of silicon dioxide ($SiO_2$) is formed so as to cover the substrate 12 by means of, e.g., chemical vapor deposition (CVD).

Figure 4:
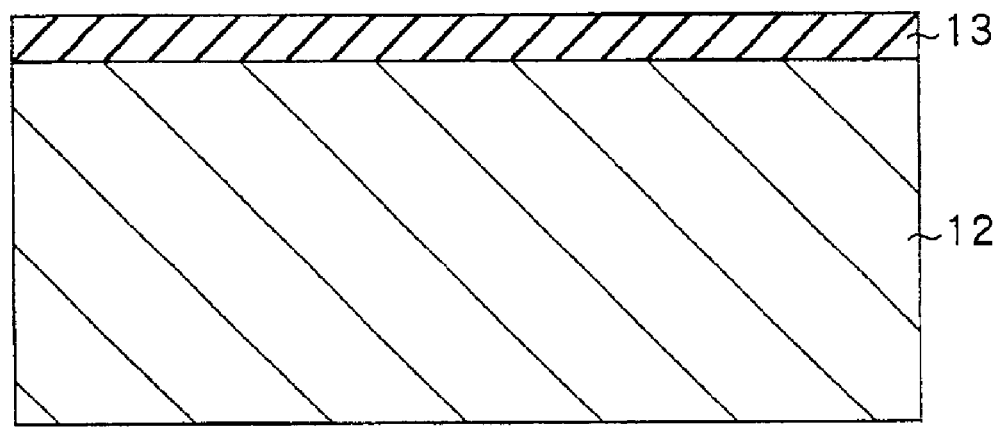
FIG. 4 is a cross section showing a manufacturing step following the step of FIG. 3.

After that, the growth base 11 is removed as shown in FIG. 4. Consequently, the warping of the substrate 12 is eliminated and the substrate 12 becomes flattened. More specifically, when the growth base 11 is made of sapphire, the growth base 12 is removed by performing wet etching at a temperature of 285° C. using an etchant including 1:1 (volume ratio) of phosphoric acid ($H_3PO_4$) and sulfuric acid ($H_2SO_4$), for example. With this case, since the growth base 11 is thin, less than or equal to 100 μm, the growth base 11 is easily removed as well as occurrence of crack due to application of stress on the substrate 12 in the removal step is prevented. Further, when crack occurs in the growth base 11 as aforementioned, removal of the growth base 11 can be performed even easier. Further, when a part of the growth base 11 is chipped in the prior step, it is further easier to remove the growth base 11. At the removal of the growth base 11, the substrate 12 is hardly damaged or contaminated at the time of etching since the substrate 12 is covered with the protecting film 13.

Alternatively, removal of the growth base 11 may be performed by means of dry etching or lapping. When dry etching is performed for the removal, chlorine gas ($Cl_2$) is used as etching gas, for example. When lapping is performed to remove the growth base 11, diamond polishing powder is used, for example.

Further, the substrate 12 may be removed from the growth base 11 by performing heating and cooling on the growth base 11 in which the substrate 12 is formed, for example. In this method, stress due to the difference in the thermal expansion coefficients of the growth base 11 and the substrate 12 is utilized. Specifically, the growth base 11 is set inside a reaction tube of an infrared furnace, and the growth base 11 is heated to, e.g., 800° C. and then cooled down, for example. Thus, the growth base 11 is removed from the substrate 12. At this time, the removal may be performed in conjunction with the etching, the lapping and the like. As for means of heating, heating with a heater or high frequency induction heating may be applied in addition to the heating using an infrared furnace.

Figure 5:
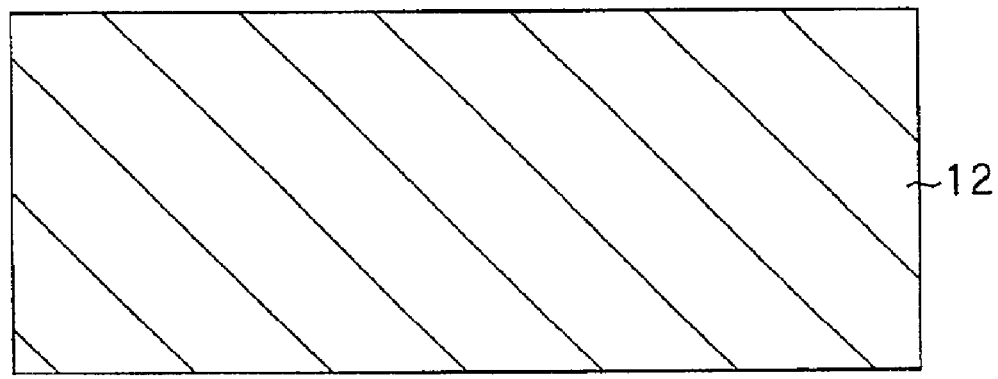
FIG. 5 is a cross section showing a manufacturing step following the step of FIG. 4.

After removing the growth base 11, as shown in FIG. 5, the protecting film 13 is removed using an etchant containing, e.g., fluorine (HF). Thereafter, the surface of the substrate 12 is flattened as needed. Specifically, the surface of the substrate 12 is flattened by etching the surface using a vapor phase etching method or a liquid phase chemical etching method, or by polishing the surface using a machinery chemical polishing method, for example. By this treatment, the surface is finely flattened and a Group III–V nitride compound semiconductor layer showing excellent crystallinity is easily grown on the substrate 12. Accordingly, the substrate 12 made of the Group III–V nitride compound is obtained.

As has been described, with the method of forming a substrate of the embodiment, the thickness of the growth base 11 is smaller than or equal to 100 μm, the thickness of the substrate 12 is greater than or equal to 200 μm and the curvature of the substrate 12 is smaller than or equal to $0.03^{-1}$. Thus, occurrence of crack in the substrate 12 is effectively prevented. Accordingly, the growth base 11 is easily removed, thereby obtaining good-quality substrate 12.

In a case where the substrate 12 is made conductive by doping impurities, when the substrate 12 is used for the manufacture of a semiconductor light emitting device, a pair of electrodes can be provided on front and back surfaces of the substrate 12, respectively. In a case where a semiconductor laser is manufactured as the semiconductor light-emitting device, end faces of a resonator are easily formed by performing cleavage.

On the basis of the model calculation and the experimental example with specific values, the relation between the thickness of the growth base 11, the thickness of the substrate 12 and the curvature K of the substrate 12 as well as the effects when the curvature K of the substrate 12 is smaller than or equal to $0.03$ cm$^{-1}$ will now be described below.

Figure 6:
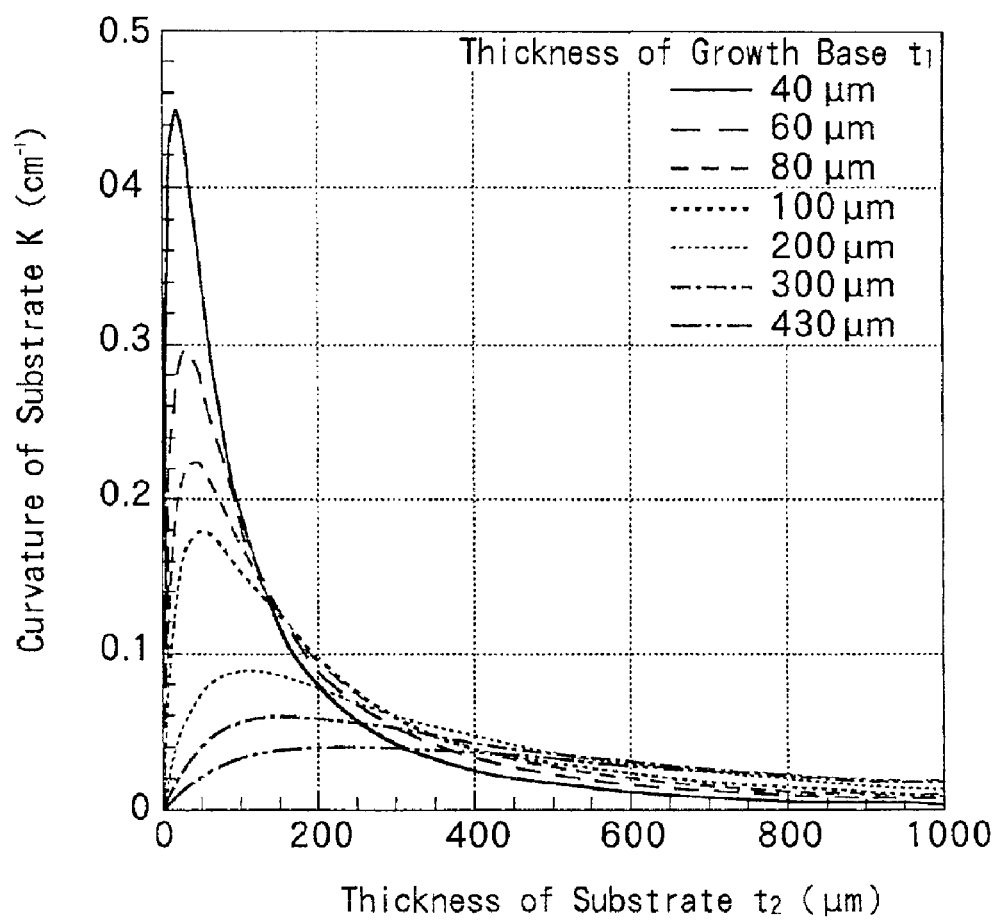
FIG. 6 is a graph showing a relation between the thickness and the curvature of the substrate formed with the method of forming a substrate according to the first embodiment of the invention.
Figure 7:
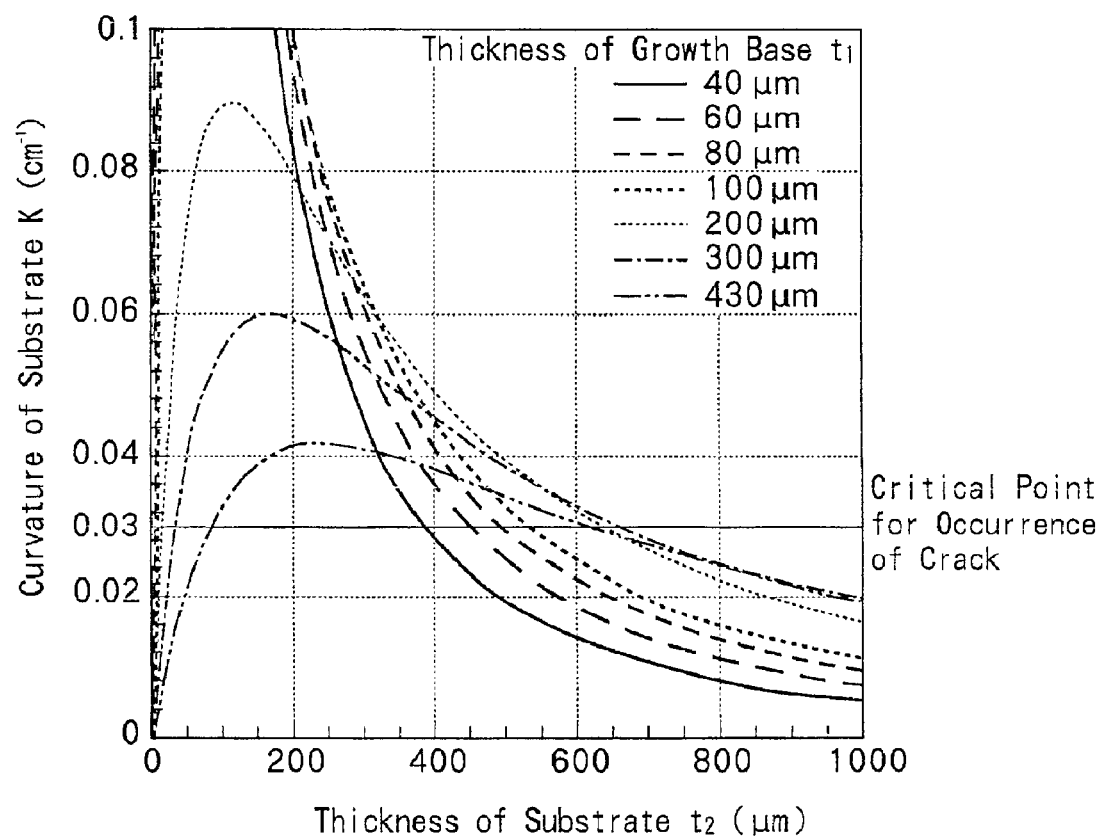
FIG. 7 is a graph showing one part of FIG. 6 enlarged.

FIG. 6 shows the relation between the thickness $t_2$ of the GaN substrate 12 and the curvature K of the substrate 12 when values in Table 1 below were assigned to the parameters in the numerical expression 1 (refer to Jpn.J.Appl.Phys., 32(1993), p1528-1533) and the thickness $t_1$ of the growth base 11 made of sapphire was varied. FIG. 7 shows a part of FIG. 6 enlarged. In FIGS. 6 and 7, the vertical axis represents the curvature K in cm$^{-1}$ and the horizontal axis represents the thickness $t_2$ of the substrate 12 in μm.

TABLE 1

| | |
|---|---|
| $T_g-T_r$ | 1015° C. |
| $\alpha_1$ | 7.50 * 10$^{-6}$° C.$^{-1}$ |
| $\alpha_2$ | 5.45 * 10$^{-6}$° C.$^{-1}$ |
| $E_1$ | 345.0 * 10$^9$ Pa |
| $E_2$ | 126.0 * 10$^9$ Pa |
| $\rho_1$ | 0.33 |
| $\rho_2$ | 0.33 |

In accordance with the calculation model shown in FIG. 6, the GaN substrates 12 with various thicknesses were grown by means of the HVPD over the growth bases 11 made of sapphire with various thicknesses, and the curvature thereof was obtained. That is, the growth bases 11 were heated to about 100° C., and then while feeding ammonia gas as nitrogen source at a velocity of 1 dm$^3$/min, gallium chloride gas was fed as gallium source, and thus, GaN substrates were grown, the gallium chloride gas being obtained by flowing hydrogen chloride gas at a velocity of 0.03 dm$^3$/min. onto a simple substance of gallium which was heated to approximately 850° C. Nitrogen gas was used as carrier gas and the nitrogen gas was fed at a velocity of 1 dm$^3$/min. Subsequently, the GaN substrates were cooled down and irradiated with laser beams. The curvature of the substrates 12 was obtained by measuring their reflecting angles.

From these experiments it was confirmed that the relation between the thickness $t_1$ of the growth base 11, the thickness $t_2$ of the substrate 12 and the curvature K, which were obtained with the actual measurement, greatly conformed to the calculation model shown in FIG. 6. As shown in FIG. 7, the curvature, 0.03 cm$^{-1}$ was the critical point for causing crack and, when the curvature K of the substrate 12 was smaller than or equal to 0.03 cm$^{-1}$, no crack occurred in the substrate 12.

That is, by making the thickness $t_2$ of the substrate 12 relative to the thickness $t_1$ of the growth base 11 that the curvature K of the substrate 12 is smaller than or equal to 0.03 cm$^{-1}$, the good-quality substrate 12 with few cracks is obtained. Further, in the case where the substrate 12 is thick, by making the growth base 11 thinner, the curvature K of the substrate 12 can be made smaller. Specially, in the case where the thickness $t_1$ of the growth base 11 is set smaller than or equal to 100 μm, the curvature K of the substrate 12 can be made smaller than or equal to $0.03c^{-1}$, further smaller than $0.025$ cm$^{-1}$, even though the thickness of the substrate 12 is not so thick, e.g., about 600 μm. Further, in a case where the growth base 11 made of compounds other than sapphire is used, the same result is obtained, but its detailed description is omitted here.

[Second Embodiment]

All steps of the method of forming a substrate according to a second embodiment of the present invention are the same as those of the first embodiment except that the substrate 12 is grown by means of the MOCVD method in addition to the hydride vapor phase deposition method. Therefore, the same reference numerals as those of the first embodiment are used and the part different from the first embodiment will be described herein below.

In this embodiment, the substrate 12 is grown in the following manner. First, the growth base 11 is placed in the reaction tube of the MOCVD apparatus (not shown). While feeding mixed gas of hydrogen gas ($H_2$) and nitrogen gas ($N_2$) as carrier gas in the reaction tube, the growth base 11 is heated to 1050° C., for example. Subsequently, while feeding, e.g., ammonia as a nitrogen source in the reaction tube, trimethylgallium (TMG;$(CH_3)_3$Ga) or triethylgallium (TEG;$((C_2H_5)_3$Ga) is fed as a gallium source, and thus, the GaN substrate 12 is grown.

When the substrate 12 is grown by means of the MOCVD, by making the thickness of the growth base 11 smaller than or equal to 100 μm, the thickness of the substrate 12 smaller than or equal to 200 μm, and the curvature of the substrate 12 due to the difference in thermal expansion coefficients of the growth base 11 and the substrate 12 smaller than or equal to $0.03^{-1}$ cm, occurrence of cracks in the substrate 12 is effectively prevented similar to the first embodiment.

Although the present invention has been described above by exemplifying the embodiment, the present invention is not limited to the embodiments and various modifications are possible. For example, in the above embodiments, described are cases where the GaN substrate 12 is formed. However, the invention may be broadly applied to cases where a substrate made of a Group III–V nitride compound including at least one element from the Group IIIB elements and at least nitrogen from the Group VB elements is subjected to manufacture. Specifically, the invention may be applied to a case where a substrate made of AlGaN mixed crystal, InN, InGaN mixed crystal or AlGaInN mixed crystal is subjected to manufacture.

At this time, when the substrate is grown by means of the hydride vapor phase deposition or the halide vapor phase deposition, a simple substance of aluminum as an aluminum source, a simple substance of boric acid as a boric acid source and a simple substance of indium as an indium source may be used, for example. When the substrate is grown by means of the MOCVD, trimethylaluminum (($CH_3)_3$Al) as a aluminum source, triethylboron (($C_2H_6)_3$B) as a boron source, trimethylindium (($CH_3)_3$In) as an indium source may be used, for example.

Further, although in the above embodiments the substrate 12 is grown by means of the hydride vapor phase deposition, halide vapor phase deposition or MOCVD, the substrate 12 may be grown by using other chemical vapor deposition methods or vapor phase epitaxy methods.

Further, in the embodiment when the growth base 11 is made of sapphire, the substrate 12 is grown on the c-plane of the growth base 11, but the substrate 12 may be grown on planes having other bearing than that of the c-plane.

Further, in the embodiment described is the calculation method of the curvature K where the growth base 11 having hexagonal crystal system is grown on the substrate 12. However, even though the growth base 11 has other crystal structures, a theoretical value of the curvature can be obtained using a numerical expression corresponding to the crystal structure. Thus, the invention is also applicable in this case.

Moreover, in the above embodiment the protecting film 13 is made of silicon dioxide but the protecting film 13 may be made of silicon nitride ($Si_xN_y$). Further, provision of the protecting film 13 is not necessary except the case that the growth base 11 is removed by means of wet etching.

As described above according to the method of forming a substrate of the invention, the thickness of the growth base is smaller than or equal to 100 μm, the thickness of the substrate is larger than or equal to 200 μm and the curvature of the substrate due to the difference in the thermal expansion coefficients of the growth base and the substrate is smaller than or equal to $0.03$ cm$^{-1}$, and thus, occurrence of crack in the substrate is effectively prevented. Accordingly, a good-quality substrate is obtained.

According to the method of forming a substrate of the invention, in the step of removing the growth base, the growth base is easily removed.

Obviously many modifications and variations of the present invention are possible in the light of the above teachings. It is therefore to be understood that within the scope of the appended claims the invention may be practiced otherwise than as specifically described.

What is claimed is:

1. A method of forming a substrate made of a Group III–V nitride compound including at least one element from Group IIIB elements and at least nitrogen (N) from Group VB elements, wherein the substrate is grown on a growth base with a thickness of smaller than or equal to 100 μm, the substrate having a thickness of larger than or equal to 200 μm and a curvature smaller than or equal to 0.03 cm$^{-1}$, the curvature being caused by a difference in thermal expansion coefficients of the growth base and the substrate.

2. A method of forming a substrate according to claim 1, wherein the growth base made of one selected form a group consisting of sapphire, silicon carbide, spinel, gallium arsenide and silicon is used.

3. A method of forming a substrate according to claim 1, wherein the substrate made of gallium nitride (GaN) is grown.

4. A method of forming a substrate according to claim 1, wherein the substrate is grown by means of hydride vapor phase deposition, halide vapor phase deposition or metal organic chemical vapor deposition.

5. A method of forming a substrate according to claim 1, wherein the substrate is doped with impurities.

6. A method of forming a substrate according to claim 5, wherein at least one selected from a group consisting of carbon (C), silicon (Si), germanium (Ge), tin (Sn), sulfur (S), selenium (Se) and tellurium (Te), or at least one selected from a group consisting of carbon, silicon, germanium, tin, beryllium (Be), magnesium (Mg), calcium (Ca), zinc (Zn) and cadmium (Cd) is doped as the impurities.

7. A method of forming a substrate according to claim 1, further comprising a step of removing the growth base.

8. A method of forming a substrate according to claim 7, wherein the growth base is removed by means of etching, lapping or heat application.

9. A method of forming a substrate according to claim 7, further comprising a step of forming a protecting film to cover the substrate prior to the step of removing the growth base.

10. A method of forming a substrate according to claim 1, further comprising a step of flattening a surface of the substrate.

11. A method of forming a substrate comprising the steps of:
- providing a growth base of a thickness smaller than or equal to 100 µm, said growth base being sapphire, silicon carbide, spinel, gallium arsenide or silicon; and
- growing the substrate on said growth base to a thickness greater than or equal to 200 µm and a curvature smaller than or equal to 0.03 cm$^{-1}$, said substrate being a Group III–V nitride compound,
- wherein said step of growing the substrate is performed after said step of providing said growth base.

12. A method of forming a substrate according to claim 11, further comprising covering said substrate with a protecting film.

13. A method of forming a substrate according to claim 12, wherein said protecting film is silicon dioxide ($SiO_2$).

14. A method of forming a substrate according to claim 12, wherein said protecting film is silicon nitride ($Si_xN_y$).

15. A method of forming a substrate according to claim 12, further comprising a step of removing said growth base from said substrate.

16. A method of forming a substrate according to claim 15, wherein said step of covering said substrate with said protecting film is performed prior to said step of removing said growth base.

17. A method of forming a substrate according to claim 15, further comprising a step of removing said protecting film from said substrate.

18. A method of forming a substrate according to claim 17, wherein said step of removing said protecting film is performed after said step of removing said growth base.

19. A method of forming a substrate according to claim 11, further comprising a step of removing said growth base from said substrate.

20. A method of forming a substrate according to claim 11, wherein said substrate is grown on and in contact with said growth base.

21. A method of forming a substrate according to claim 11, wherein said substrate is grown by means of hydride vapor phase deposition, halide vapor phase deposition, metal organic chemical vapor deposition, or vapor phase epitaxy deposition.

22. A method of forming a substrate according to claim 11, wherein said curvature is caused by a difference in thermal expansion coefficients of said growth base and said substrate.

23. A method of forming a substrate according to claim 11, wherein said substrate is doped with impurities.

24. A method of forming a substrate according to claim 23, wherein at least one selected from a group consisting of carbon (C), silicon (Si), germanium (Ge), tin (Sn), sulfur(S), selenium (Se) and tellurium (Te), or at least one selected from a group consisting of carbon, silicon, germanium, tin, beryllium (Be), magnesium (Mg), calcium (Ca), zinc (Zn) and cadmium (Cd) is doped as the impurities.

* * * * *